(12) United States Patent
Cok et al.

(10) Patent No.: US 11,282,439 B2
(45) Date of Patent: Mar. 22, 2022

(54) ANALOG PULSE-WIDTH-MODULATION CONTROL CIRCUITS

(71) Applicant: X Display Company Technology Limited, Dublin (IE)

(72) Inventors: Ronald S. Cok, Rochester, NY (US); Robert R. Rotzoll, Colorado Springs, CO (US); Matthew Alexander Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/930,576

(22) Filed: Jul. 16, 2020

(65) Prior Publication Data

US 2022/0020315 A1 Jan. 20, 2022

(51) Int. Cl.
| G09G 3/32 | (2016.01) |
| H03K 3/017 | (2006.01) |
| G09G 3/3233 | (2016.01) |
| G11C 19/28 | (2006.01) |

(52) U.S. Cl.
CPC .............. *G09G 3/32* (2013.01); *G09G 3/3233* (2013.01); *H03K 3/017* (2013.01); *G09G 2310/0286* (2013.01); *G09G 2320/064* (2013.01); *G11C 19/28* (2013.01)

(58) Field of Classification Search
CPC .......... G09G 3/20; G09G 3/32; G09G 3/3216; G09G 3/3233; G09G 3/3225; G09G 3/3208; G09G 3/3241; G09G 3/325; H03K 3/017
See application file for complete search history.

(56) References Cited

U.S. PATENT DOCUMENTS

| 7,622,367 | B1 | 11/2009 | Nuzzo et al. |
| 8,506,867 | B2 | 8/2013 | Menard |
| 8,722,458 | B2 | 5/2014 | Rogers et al. |
| 8,889,485 | B2 | 11/2014 | Bower |
| 9,640,108 | B2 | 5/2017 | Cok et al. |
| 9,818,725 | B2 | 11/2017 | Bower et al. |
| 9,928,771 | B2 | 3/2018 | Cok |
| 10,360,846 | B2 | 7/2019 | Cok et al. |
| 10,832,609 | B2 | 11/2020 | Rotzoll et al. |
| 2009/0115703 | A1* | 5/2009 | Cok .................. G09G 3/3233 345/76 |
| 2016/0093600 | A1 | 3/2016 | Bower et al. |

(Continued)

OTHER PUBLICATIONS

Cok, R.S. et al., AMOLED displays with transfer-printed integrated circuits, Journal of SID, 19(4):335-341, (2011).

*Primary Examiner* — Xuemei Zheng
(74) *Attorney, Agent, or Firm* — Choate, Hall & Stewart LLP; Michael D. Schmitt

(57) ABSTRACT

An analog pulse-width-modulation circuit comprises an analog storage circuit, a load circuit responsive to control signals to load (e.g., store analog information in) the analog storage circuit, a discharge circuit that discharges the analog storage circuit over time, a constant-current supply providing a constant current, a digital switch responsive to the discharge circuit that switches the constant current, and a functional element connected to the digital switch that operates in response to the constant current. The analog pulse-width-modulation circuit can comprise an output control circuit that isolates or connects the discharge circuit from the analog storage circuit.

19 Claims, 12 Drawing Sheets

(56) References Cited

U.S. PATENT DOCUMENTS

2018/0197471 A1* 7/2018 Rotzoll ................ H01L 25/167
2019/0371232 A1* 12/2019 Kim ........................ G09G 3/32
2021/0065616 A1* 3/2021 Kim ..................... G09G 3/3233
2021/0210003 A1* 7/2021 Kim ........................ G09G 3/32

* cited by examiner

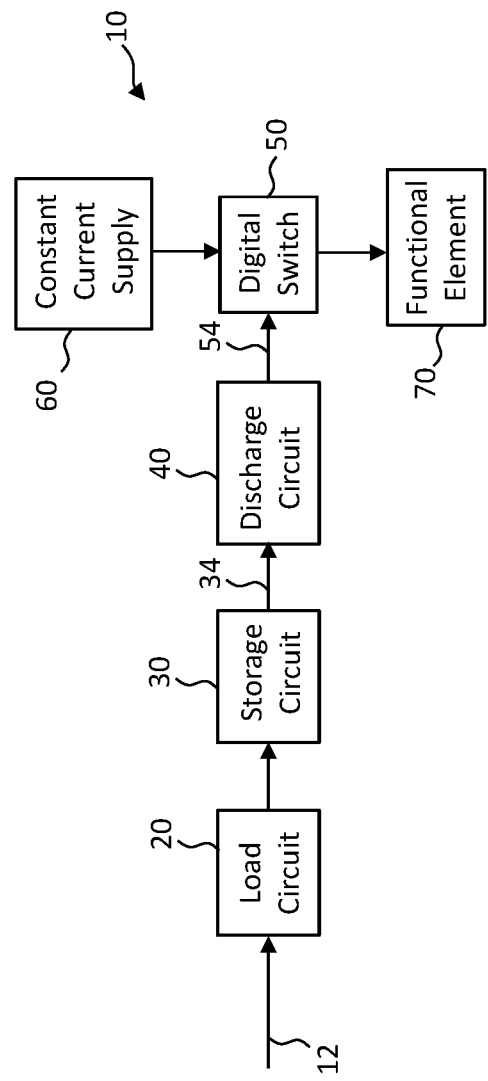

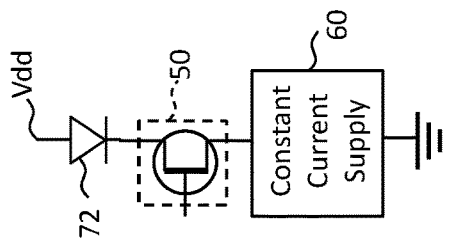
FIG. 8E
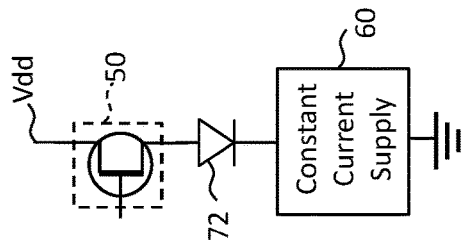
FIG. 8F
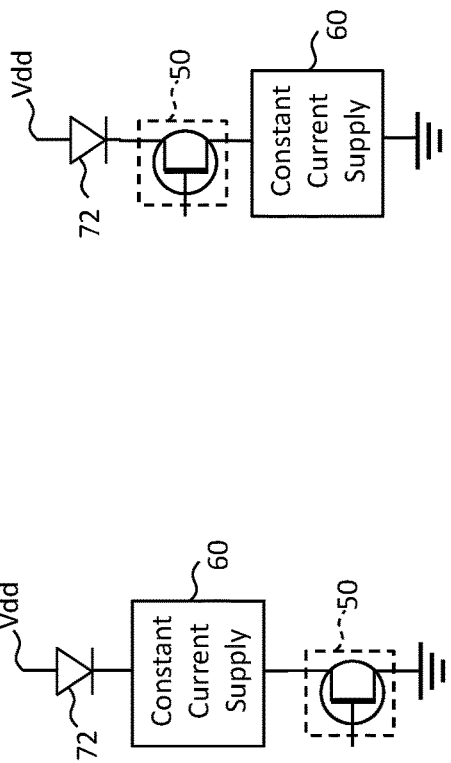
FIG. 8C
FIG. 8D
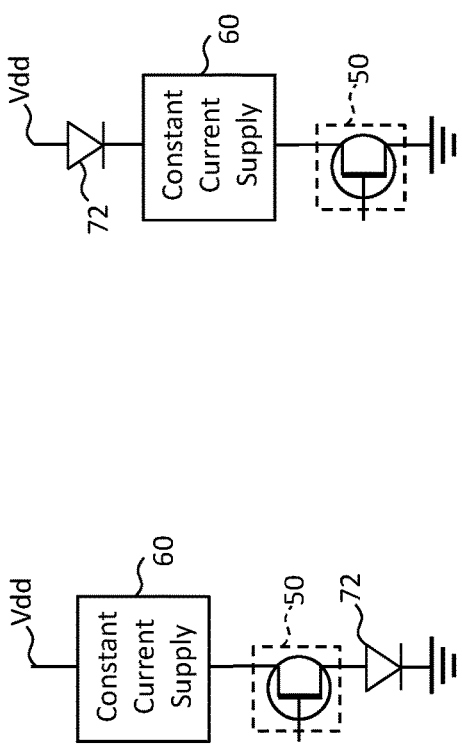
FIG. 8A
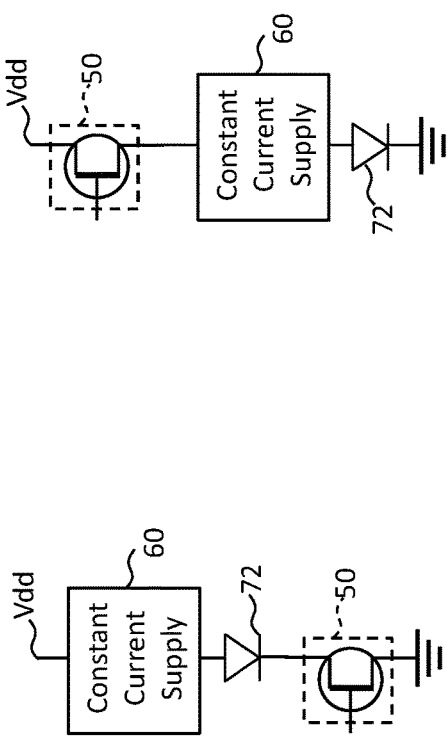
FIG. 8B

ANALOG PULSE-WIDTH-MODULATION CONTROL CIRCUITS

TECHNICAL FIELD

The present disclosure relates to pixel control circuits for light-emitting displays.

BACKGROUND

Large-format inorganic light-emitting diode (iLED) displays are used in outdoor and stadium displays. Because the iLEDs are relatively large, for example one square millimeter, they are restricted to relatively low-resolution displays. However, as iLED technology develops, there is increasing interest in applying smaller iLEDs to displays having higher resolution. Full-color displays typically include pixels with three (or more) emitters, usually red, green, and blue emitters, distributed in an array over the display surface. For example, inorganic light-emitting diodes used in flat-panel displays are disclosed in U.S. Pat. No. 9,818,725 entitled Inorganic-Light-Emitter Display with Integrated Black Matrix.

Inorganic light-emitting diodes are semiconductor light sources relying on p-n junctions to emit light when a suitable voltage is applied across the light-emitting diode. The color of the light emitted from the iLED corresponds to the energy bandgap of the semiconductor. Thus, different semiconductor materials can produce different colors of light when stimulated with suitably different voltages. Typical materials include InGaN (emitting blue light), AlGaP (emitting green light), and AlGaAs (emitting red light), among many other materials. For most inorganic light-emitting diodes, the efficiency with which the different materials emit light can depend on the density of the current passing through the materials.

Most active-matrix flat-panel displays use thin-film circuits to control the pixels in the display. The thin-film circuits typically use a combination of transistors and capacitors to drive each light-emitter in each pixel. For example, liquid crystal displays (LCDs) commonly use a one-transistor, one-capacitor voltage regulated circuit to control the liquid crystals for each light emitter. Early organic light-emitting diode (OLED) displays used a two-transistor, one-capacitor circuit to control the OLEDs. However, because OLED brightness is determined by the current passing through the OLED, variable current-control circuits are often used to control OLEDs in OLED displays.

The efficiency of inorganic light-emitting diodes varies according to the density of current that passes through the iLED and different LEDs that emit different colors of light are most efficient at different current densities. This aspect of LEDs in a display is addressed in U.S. Pat. Nos. 9,640,108 and 9,928,771, which disclose an externally supplied pulse width modulation (PWM) signal to control brightness for digital pixel values stored in each pixel. U.S. Pat. No. 10,360,846 discloses pixel circuits that each generate a pulse width modulation control signal for digital pixel value stored in each pixel. Digital circuits can be more complex than analog circuits and can operate at higher frequencies.

There is a need, therefore, for pixel control circuits that provide effective and efficient control of pixel light emitters.

SUMMARY

According to some embodiments of the present disclosure, an analog pulse-width-modulation circuit comprises an analog storage circuit, a load circuit responsive to control signals to store analog information in the analog storage circuit, a discharge circuit that discharges the analog storage circuit over time, a constant-current supply providing a constant current, a digital switch responsive to the discharge circuit that switches the constant current, and a functional element connected to the digital switch that operates in response to the constant current. The analog pulse-width-modulation circuit can comprise an output control circuit that isolates or connects the discharge circuit from the analog storage circuit.

According to some embodiments of the present disclosure, an analog pulse-width-modulation circuit comprises an analog storage circuit, a load circuit responsive to control signals to load the analog storage circuit, a discharge circuit operable to discharge the analog storage circuit over time, a constant-current supply that provides a constant current, a digital switch responsive to the discharge circuit to switch the constant current, and a functional element connected to the digital switch that operates in response to the constant current when provided.

In some embodiments, the analog pulse-width-modulation circuit comprises an output control circuit that isolates the discharge circuit from the analog storage circuit or connects the discharge circuit to the analog storage circuit. The analog storage circuit can comprise a capacitor, one or more of the load circuit, the discharge circuit, and the digital switch can comprise a transistor, and the transistor can comprise a depletion-mode JFET, MOSFET, or MESFET, an enhancement mode JFET, MOSFET, or MESFET, an n-channel JFET, MOSFET, or MESFET, or a p-channel JFET, MOSFET, or MESFET. In some embodiments, the functional element can comprise an inorganic light-emitting diode, the discharge circuit can comprise a resistor, and the discharge circuit can comprise a transistor electrically connected in series with the resistor.

According to some embodiments of the present disclosure, a current-control signal input into the analog pulse-width-modulation circuit specifies a magnitude of the constant current of the constant current circuit and controls the discharge circuit. The discharge circuit and the constant-current supply can be a combined circuit, the digital switch can be a bipolar transistor and the discharge circuit and the digital switch can be a combined circuit that discharges the analog storage circuit through the digital switch. The discharge circuit and the digital switch can be a combined circuit. The digital switch, the functional element, and the constant-current supply can be electrically connected in series. The functional element can operate more efficiently at one current than another current or the functional element can be most efficient at a pre-determined current.

According to some embodiments of the present disclosure, an analog pulse-width-modulation pixel circuit can comprise two or more analog pulse-width-modulation circuits, wherein, for each of the two or more analog pule-width-modulation circuits, the functional element comprises a light emitter and a control shift register operable to provide a control signal for each of the two or more analog pulse-width-modulation circuits. The shift register can be operable to sequentially provide a load signal to each of the analog pulse-width-modulation circuits in response to a control signal. The functional element in each of the two or more analog pulse-width-modulation circuits can operate most efficiently at a different constant current. The light emitter can be an inorganic light-emitting diode.

According to some embodiments of the present disclosure, an analog pulse-width-modulation structure comprises a circuit substrate, an element substrate separate from the circuit substrate, and an analog pulse-width-modulation circuit. Any one or more of the load circuit, the analog storage circuit, the discharge circuit, the digital switch, and the constant-current supply can be disposed (e.g., formed) on or in the circuit substrate and the functional element can be disposed on or at least partially in the element substrate and electrically connected to at least one of the load circuit, the analog storage circuit, the discharge circuit, the digital switch, and the constant-current supply. The circuit substrate can comprise a semiconductor and a fractured or separated circuit tether and the element substrate comprises a fractured or separated element tether.

According to some embodiments of the present disclosure, an analog pulse-width-modulation display comprises a display substrate and an array of analog pulse-width-modulation pixel circuits arranged in rows and columns on the display substrate. The display can be operable to provide a control signal of the control signals in common to each pixel circuit of the analog pulse-width-modulation pixel circuits in each of the rows (e.g., individually), each of the columns (e.g., individually), or both each of the rows and each of the columns (e.g., individually, e.g., respectively).

Certain embodiments of the present disclosure provide a control circuit with reduced-frequency control signals, a reduced number of circuit elements, and effective constant-current control. Control circuits disclosed herein are suitable for inorganic micro-light-emitting diodes and can be applied in an array of pixels in a display.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a block diagram according to illustrative embodiments of the present disclosure;

FIGS. 8A-8F are schematic circuit diagrams according to illustrative embodiments of the present disclosure;

Figure 1B:
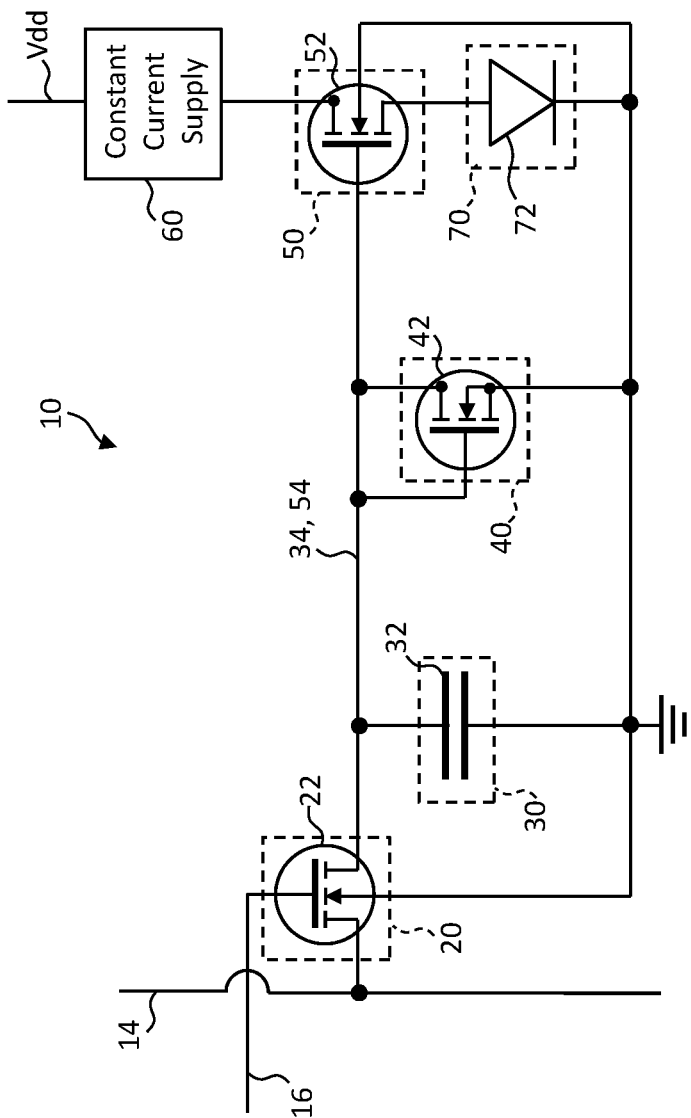
FIG. 1B is a schematic diagram corresponding to FIG. 1A.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present disclosure provide control circuits suitable for functional elements that operate most efficiently at a given, constant and invariant current. For example, inorganic light-emitting diodes (iLEDs) can operate most efficiently at a given current. Moreover, different types of iLEDs or iLEDs that emit different colors of light can operate most efficiently at different constant currents. Analog circuits can be simpler with fewer elements and can operate at lower frequencies than digital circuits performing similar functions. Pulse-width-modulation (PWM) circuits can provide a constant current to a functional element that operates for variable time periods. When the functional element is off, no current flows to the functional element. When the functional element is on, ideally a constant, unvarying current at a fixed voltage flows to the operational functional element. According to some embodiments of the present disclosure, an analog PWM circuit can control each (e.g., respective) light emitter in each pixel in an active-matrix display comprising an array of pixels. When operational, the light emitter emits light at a constant luminance. If the light emitter is turned on and off quickly (e.g., for less than 40 msecs), the human visual system cannot perceive the switching and instead perceives a variable brightness depending on the amount of time the light emitter is on at the predetermined constant luminance. An analog quantity (e.g., effectively a charge) is continuous rather than discrete or digital. Thus, the time period for which functional element 70 operates can be likewise continuous in time.

According to some embodiments of the present disclosure and as illustrated in FIG. 1A, an analog pulse-width-modulation circuit 10 comprises an analog storage circuit 30, a load circuit 20 responsive to control signals 12 to load (e.g., store analog information in) the analog storage circuit 30, a discharge circuit 40 that discharges the analog storage circuit 30 over time, a constant-current supply 60 providing a constant current, a digital switch 50 responsive to discharge circuit 40 that switches the constant current, and a functional element 70 connected to digital switch 50 that operates in response to the constant current. Analog storage circuit 30 can output a storage signal 34 that is discharged over time by discharge circuit 40 to produce switch signal 54 that controls digital switch 50. Analog information is effectively continuous and analog storage circuit 30 effectively stores a continuous and analog quantity, as opposed to a discrete digital quantity.

Figure 9:
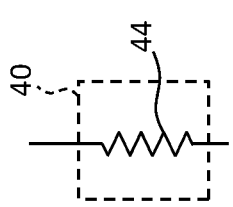
FIGS. 9-10 are schematic diagrams of discharge circuits according to illustrative embodiments of the present disclosure.
Figure 10:
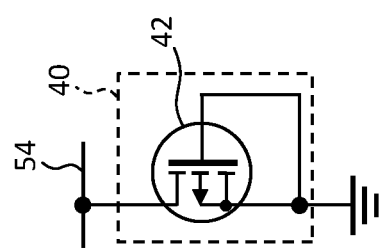

Digital switch 50 is a binary digital switch because it does not continuously modulate the current supplied by the constant-current supply 60 but rather operates in a first mode in which the switch is turned off and no current flows through the digital switch 50 and a second mode in which the switch is turned on and current flows through the digital switch 50 at a constant current specified by constant-current supply 60. Digital switch 50 does not function as an analog switch or amplifier and does not continuously modulate the current passing through digital switch 50 in response to switch signal 54 to pass, for example an amount greater than zero and less than the current supplied by constant-current supply 60. Rather, digital switch 50 passes either zero current or the predefined constant current from constant-current supply 60. Digital switch 50 can be a circuit with one or multiple circuit elements. According to some embodiments, digital switch 50 comprises a threshold detector in combination with a transistor switch that turns off when switch signal 54 is less than a threshold voltage that turns the transistor switch on. The threshold voltage is selected to turn off when the PWM signal specified by the charge deposited in analog storage circuit 30 is desired to turn off and should be greater than a minimum voltage from discharge circuit 40, to ensure that digital switch 50 can turn off Certain embodiments of the present disclosure can be applied to active-matrix iLED displays 95. As shown, for example, in FIGS. 1B, 11, and 15 control signals 12 can comprise a row-control signal 16 (e.g., a wire or trace) and a column-data signal 14 (e.g., a wire or trace) electrically connected to an array of pixels 94 arranged in rows and columns on a display substrate 90 in an active-matrix display 95. Each pixel 94 can comprise one or multiple functional elements 70, each of which can comprise an iLED 72, for example a micro-iLED 72. Each of the multiple functional elements 70 can be or include a different iLED 72 that emits a different color of light when provided with electrical current at a suitable voltage. Analog storage circuit 30 can be or include a storage capacitor 32 that stores electrical charge deposited in storage capacitor 32 by row-control signal 16 and column-data 14 control signals through load circuit 20 (e.g., through load transistor 22 of load circuit 20). Discharge circuit 40 can be or include a discharge resistor 44 (as shown in FIG. 9) or a discharge transistor 42, as shown in FIGS. 1B and 10. Discharge circuit 40 discharges analog storage circuit 30, for example reducing the charge stored on storage capacitor 32. If discharge circuit 40 comprises discharge resistor 44, storage capacitor 32 and discharge resistor 44 form an RC circuit that discharges storage capacitor 32 exponentially over time. If discharge circuit 40 comprises discharge transistor 42, storage capacitor 32 can discharge linearly over time. Digital switch 50 can comprise a switch transistor 52. Constant-current supply 60 can similarly comprise an electronic transistor circuit and can be constructed using design principles known in the electronic arts.

Figure 2A:
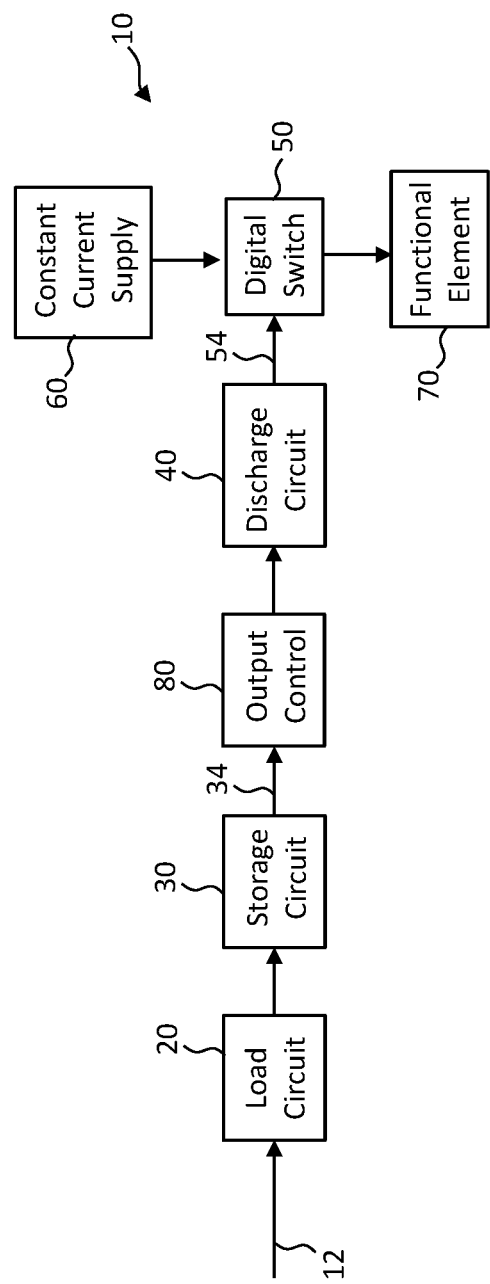
FIG. 2A is a block diagram according to illustrative embodiments of the present disclosure.

According to some embodiments of the present disclosure and as illustrated in FIG. 2A, analog PWM circuit 10 comprises an output control circuit 80, for example between storage circuit 30 and discharge circuit 40. In some embodiments, output control circuit 80 controls the electrical connection between analog storage circuit 30 and discharge and digital switch circuits 40, 50. When output control circuit 80 is disabled, discharge circuit 40 and digital switch 50 are disconnected from analog storage circuit 30 so that analog storage circuit 30 can be loaded by load circuit 20 independently of discharge circuit 40 and digital switch 50. Thus, the load on analog storage circuit 30 is reduced, for example removing any RC time constant burden on depositing charge into analog storage circuit 30 due to discharge circuit 40, thereby increasing the rate at which analog PWM circuit 10 can operate. When output control circuit 80 is enabled, analog storage circuit 30 is connected to discharge circuit 40 and discharge circuit 40 operates to discharge analog storage circuit 30.

Figure 2B:
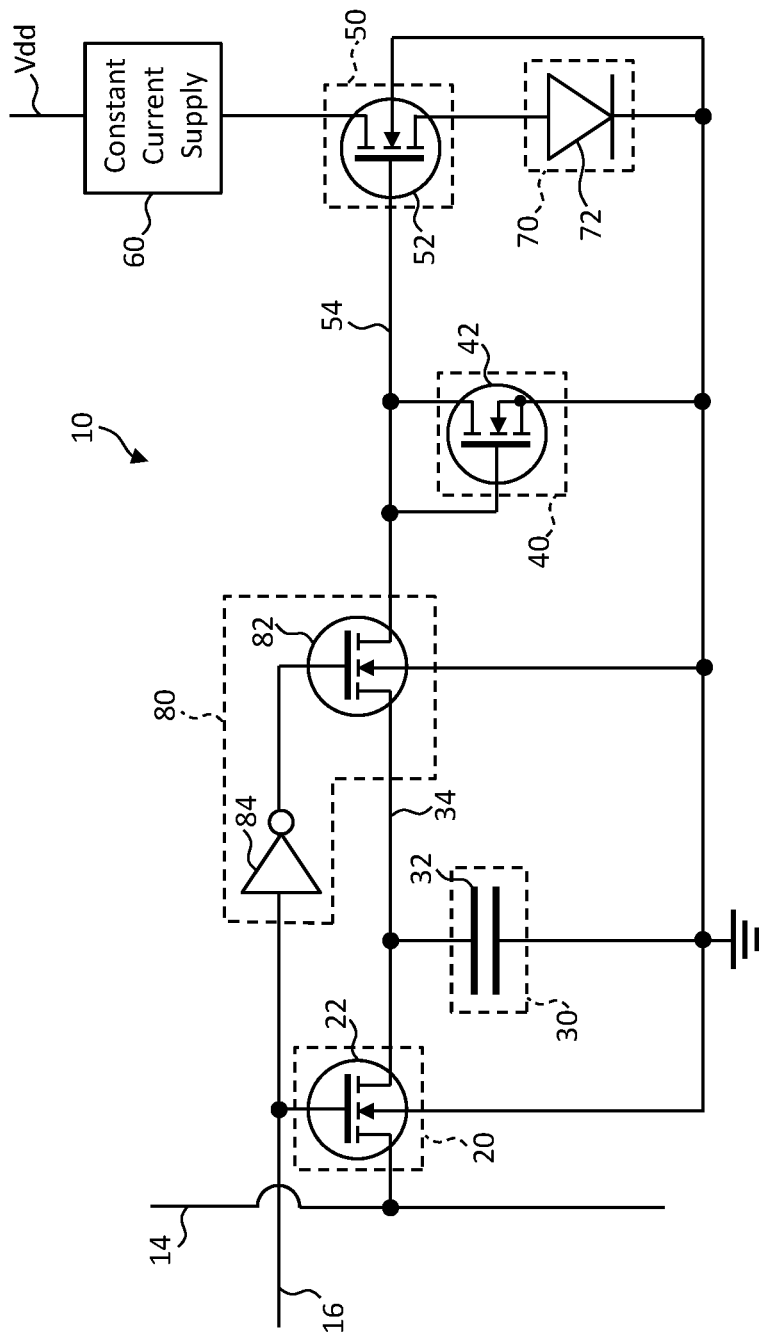
FIG. 2B is a schematic diagram corresponding to FIG. 2A.

Referring to FIG. 2B, output control circuit 80 can operate inversely from load circuit 20 (as shown with inverter 84 connected to the gate of output control transistor 82) so that when load circuit 20 is enabled in response to row-control signal 16 and deposits charge in analog storage circuit 30 (e.g., storage capacitor 32) from column-data signal 14, discharge circuit 40 is isolated and disconnected from analog storage circuit 30. When load circuit 20 is disabled by row-control signal 16, output control signal 80 is enabled and electronically connects discharge circuit 40 to analog storage circuit 30. Thus, loading information is separated in time from outputting information (e.g., emitting light from iLED 72) so that analog PWM circuit 10 operates with a load period independent of a frame period, as is generally useful in active-matrix displays 95.

According to some embodiments of the present disclosure, transistors of analog PWM circuit 10 can be any of a variety of transistors, for example transistors such as those known in the electronics, integrated circuit, and display industries. Transistors can be thin-film transistors (TFTs), for example amorphous transistors or polysilicon transistors, and analog PWM circuit 10 can be a semiconductor thin-film circuit formed on a substrate, such as a display substrate 90. In some embodiments, transistors are crystalline silicon or compound semiconductor transistors, for example made in an integrated circuit process. Transistors that can be used in analog PWM circuit 10 include bipolar transistors or field-effect transistors (FETs), for example junction-gate field-effect transistors (JFETs), metal-oxide-semiconductor field-effect transistors (MOSFETs), or metal-semiconductor field-effect transistors (MESFETs). In some embodiments, FETs are enhancement-mode FETs, depletion-mode FETs, n-channel FETs, or p-channel FETs, e.g., as shown in FIG. 10.

As illustrated in FIG. 1B, load transistor 22, discharge transistor 42, and switch transistor 52 can comprise n-channel enhancement-mode metal-oxide field effect transistors (MOSFETs). However, embodiments of the present disclosure are not limited to such transistors, and bipolar transistors, field-effect transistors, depletion-mode transistors, and n-channel or p-channel transistors, or a combination thereof, can be used in one or more of the load, discharge, and digital switch circuits 20, 40, or 50 or constant-current supply 60. Moreover, inverted voltage can be used. For example analog storage circuit 30, discharge circuit 40, and functional element 70 can be electrically connected to $V_{dd}$ rather than to ground, as those skilled in the art of electronic circuit design will understand. In some embodiments, if discharge circuit 40 comprises a transistor, the transistor gate signal can be electrically connected to the transistor drain rather than the transistor source, for example with depletion-mode FET circuits.

Figure 3:
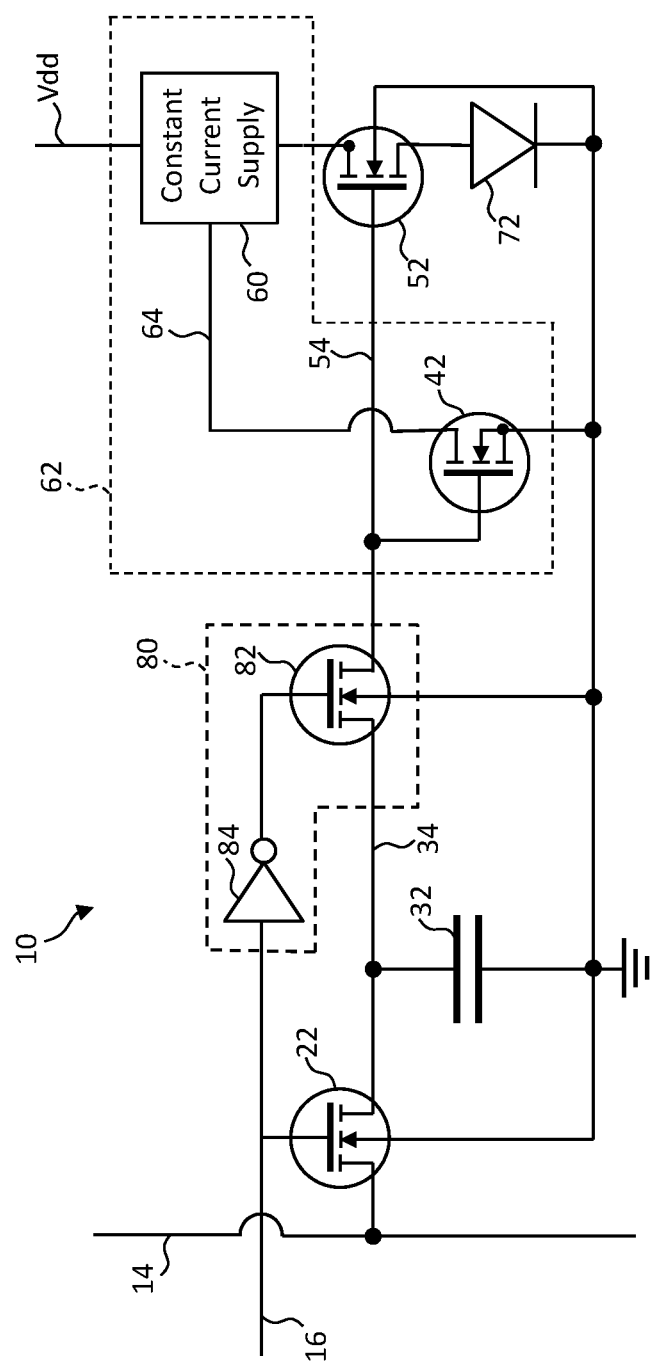
FIG. 3 is a schematic circuit diagram according to illustrative embodiments of the present disclosure.
Figure 4:
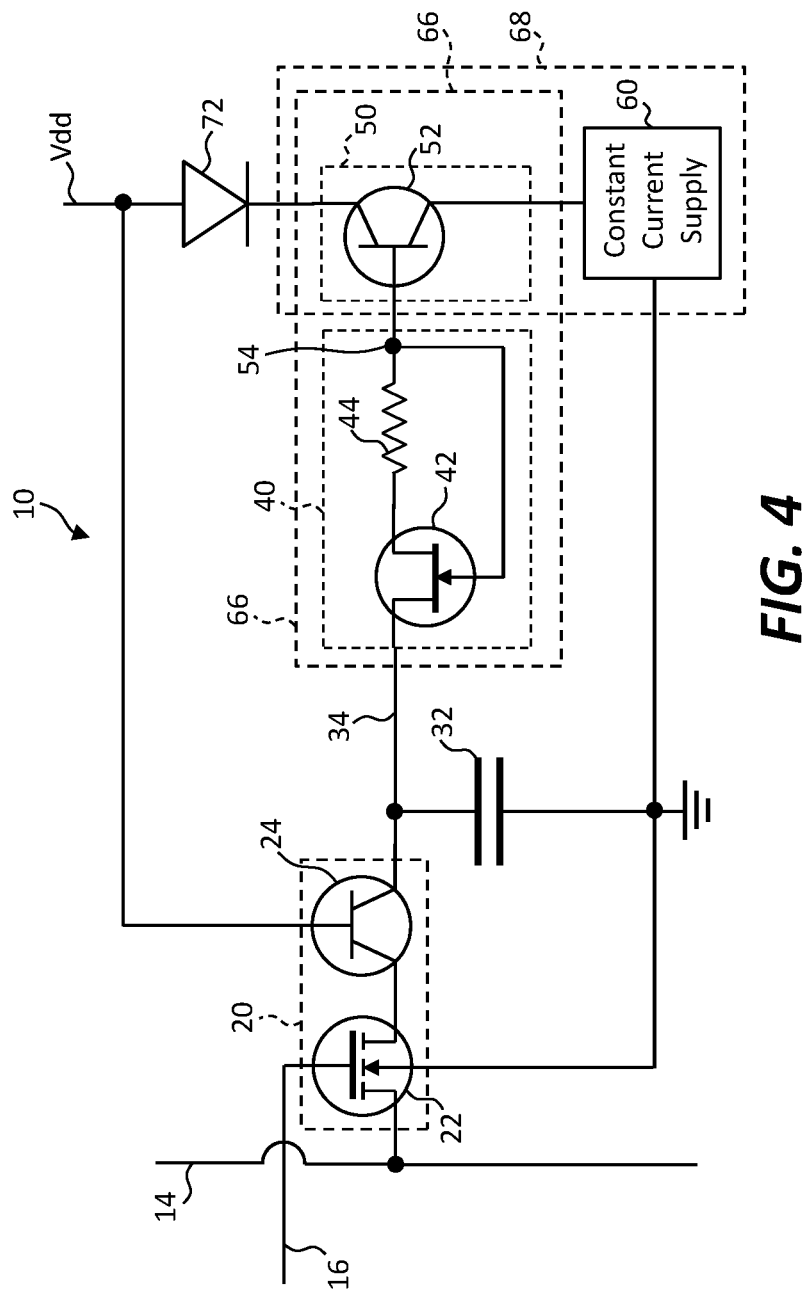
FIG. 4 is a schematic circuit diagram according to illustrative embodiments of the present disclosure.

According to some embodiments of the present disclosure, circuits of analog PWM circuit 10 can be combined into a combined circuit with one or more common circuit elements or one or more common electrical connections, or both one or more common circuit elements and one or more common electrical connections. Referring to FIG. 3, output control circuit 80 comprises inverter 84 and output control transistor 82. Constant-current supply 60 and discharge transistor 42 (or discharge resistor 44) form an integrated current-supply discharge circuit 62 having a current-control signal 64 that commonly controls the magnitude of the current supplied to functional element 70 (iLED 72 in this case) and the rate of discharge of discharge transistor 42. Referring to FIG. 4, switch transistor 52 comprises a bipolar transistor in digital switch 50 that is integrated with discharge circuit 40 to form an integrated current discharge and control circuit 66. Discharge circuit 40 discharges analog storage circuit 30 (storage capacitor 32) through a JFET (discharge transistor 42), discharge resistor 44, and switch transistor 52 itself. According to some embodiments, constant-current supply 66 can be integrated with digital switch 50 in a common circuit with common connections or components to form an digital switch and constant-current supply 68. According to some embodiments and as illustrated in FIG. 4, load circuit 20 can comprise an amplifier 24, for example a bipolar transistor that amplifies column-data signal 14 to provide amplified storage signal 34.

Figure 5:
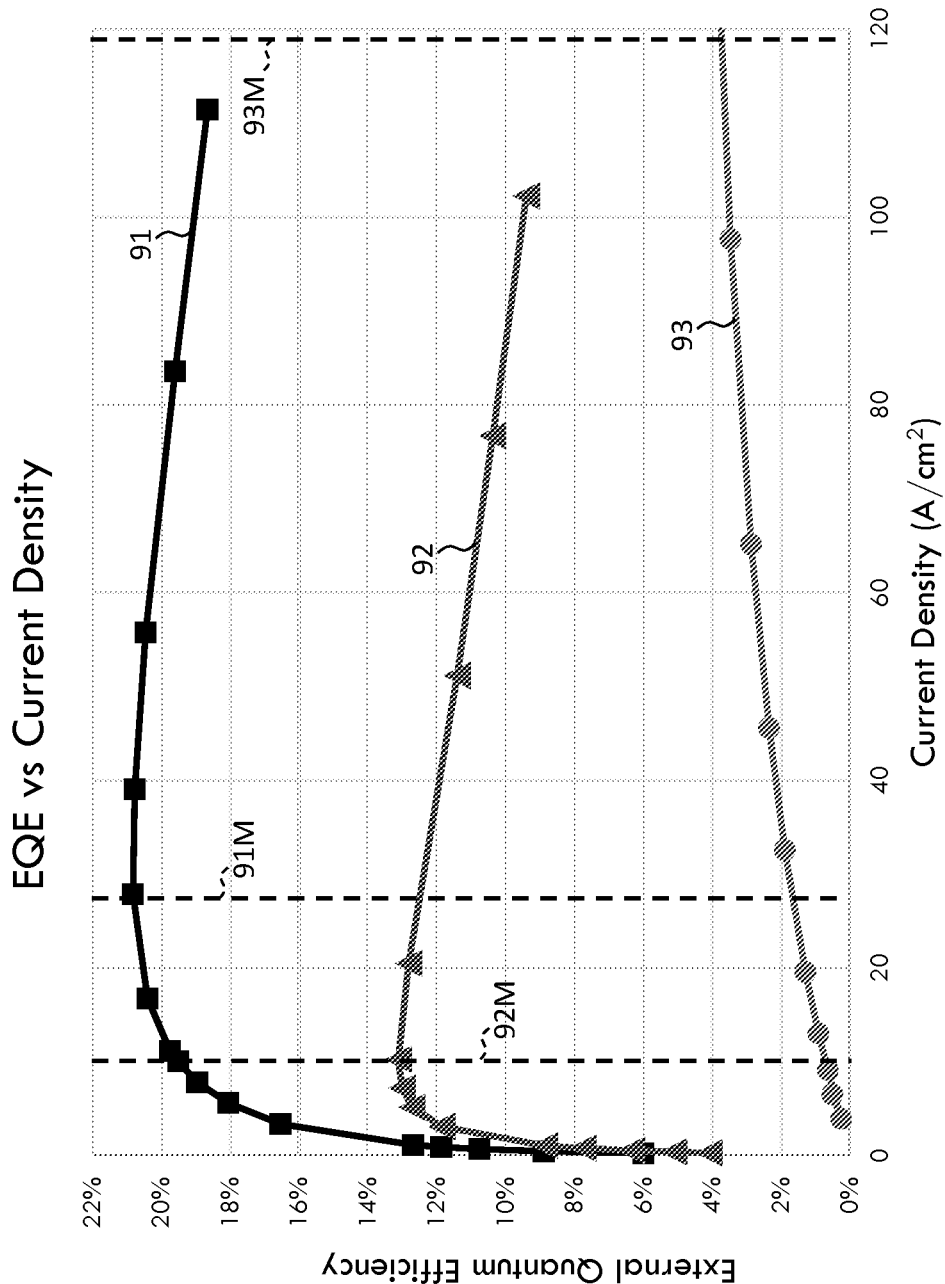
FIG. 5 is a graph illustrating iLED light output efficiency with respect to current density useful in understanding embodiments of the present disclosure.
Figure 15:
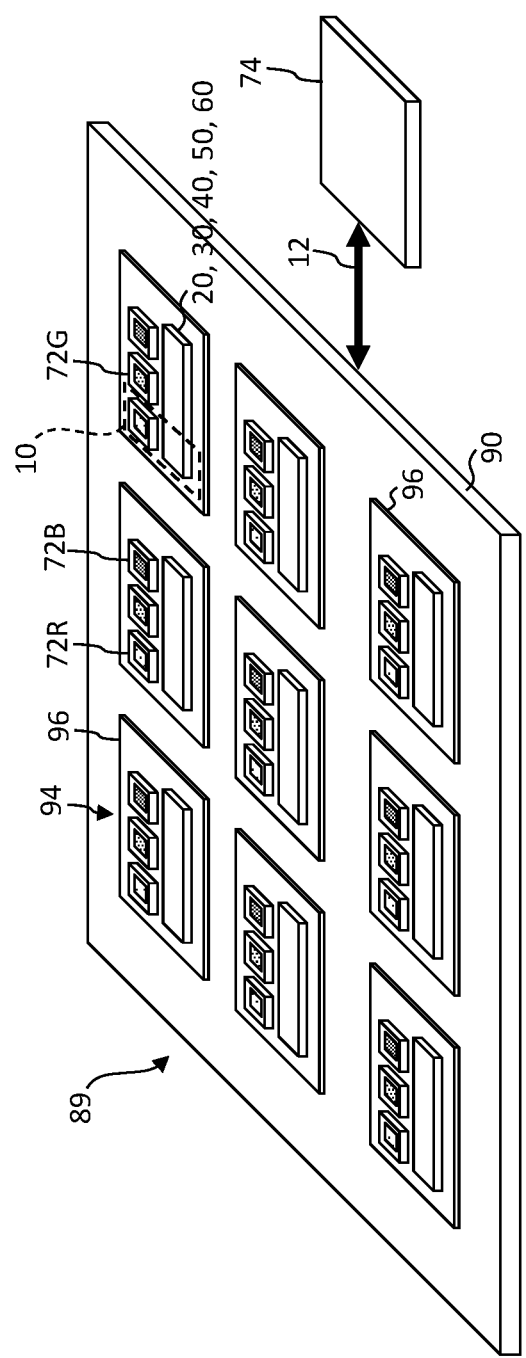
FIG. 15 is a schematic perspective of a display according to illustrative embodiments of the present disclosure.

Referring to FIG. 5, according to some embodiments of the present disclosure, first, second, and third iLEDs 72 (e.g., red iLED 72R, green iLED 72G, and blue iLED 72B, as shown in FIG. 15) each have different light-output efficiencies (e.g., external quantum efficiencies) with respect to current density in the respective iLED 72. According to some embodiments, the first, second, and third iLEDs 72 can also have different preferred driving voltages, for example a forward voltage across the diode. Blue iLED 72B can have a blue efficiency vs. current density 91, green iLED 72G can have a green efficiency vs. current density 92, and red iLED 72R can have a red efficiency vs. current density 93 as shown in FIG. 5. Blue efficiency vs. current density 91 has a blue efficiency maximum 91M, green efficiency vs. current density 92 has a green efficiency maximum 92M, and red efficiency vs. current density 93 has an approximate red efficiency maximum 93M (that can be at a greater current density than is shown in FIG. 5, given the limited data set acquired and plotted in FIG. 5, e.g., of about 4-5%).

The efficiency versus current density is shown in FIG. 5 for three different iLEDs 72 emitting blue, green, and red light, respectively when provided with current at a suitable voltage. Other iLEDs (either in construction or peak emission wavelength) can have different efficiency versus current density characteristics. Blue iLED efficiency 91 has a blue iLED efficiency maximum 91M at approximately 27 A/cm$^2$, green iLED efficiency 92 has a green iLED efficiency maximum 92M at approximately 9 A/cm$^2$, and red iLED efficiency curve 91 has a red iLED efficiency maximum 93M at approximately 120 A/cm$^2$ (or more). The luminance (brightness) of each iLED 72 can be controlled by changing the amount of current passing through each iLED 72 but, as is shown in FIG. 5, such a control method will reduce the efficiency of light generation in each iLED 72, since iLED 72 light-output efficiency changes with changes in current. According to some embodiments of the present disclosure, analog PWM circuit 10 can provide a more efficient control method that operates iLEDs 72 at approximately their most efficient current while also providing variable luminance for the iLEDs 72 using analog PWM control.

Referring back to FIG. 1B, in operation, row-control signal 16 provides a select signal to the gate of load transistor 22 that enables load circuit 20. Column-data signal 14 provides a charge corresponding to a desired luminance from pixel 94. Enabled load circuit 20 deposits the charge into analog storage circuit 30, e.g., storage capacitor 32. Row-control signal 16 then deselects and turns off load circuit 20, leaving a charge deposited in analog storage circuit 30. Analog storage circuit 30 then outputs storage signal 34 corresponding to the amount of charge in analog storage circuit 30. In FIG. 1B, storage signal 34 is a switch signal 54 that switches on digital switch 50, if switch signal 54 is sufficiently large. In response to switch signal 54, digital switch 50 conducts a constant electrical current to functional element 70. Discharge circuit 40 reduces the charge in capacitor 32 and consequently the magnitude of storage signal 34 over time. Eventually, the magnitude of storage signal 34 and switch signal 54 is reduced so far that switch signal 54 no longer turns on digital switch 50 and constant current from constant-current supply 60 no longer flows through functional element 70, turning functional element 70 off. A minimum voltage across discharge circuit 40 should be less than the minimum switching voltage of switch circuit 50, so that switch circuit 50 can turn off when analog storage circuit 30 is discharged to the maximum extent possible by discharge circuit 40. Thus, some embodiments of analog storage circuit 30 will turn on functional element 70 with a constant current for a time dependent on the charge deposited by load circuit 20 into analog storage circuit 30, providing analog pulse-width-modulation constant-control to functional element 70 suitable for iLEDs 72.

With respect to FIG. 2B, when row-control signal 16 enables load circuit 20, it disconnects discharge circuit 40 and digital switch 50 from analog storage circuit 30 so that load circuit 20 and analog storage circuit 30 do not interact electronically with discharge circuit 40 and digital switch 50, decreasing the impedance of storage signal 34 and improving the rate at which analog storage circuit 30 can be loaded. When row-control signal 16 disables load circuit 20, it connects discharge circuit 40 and digital switch 50 to analog storage circuit 30 so that analog storage circuit 30 discharges, digital switch 50 turns on, and functional element 70 turn on, until switch signal 54 decreases in magnitude to the point that digital switch 50 turns off. Thus, the load process for analog storage circuit 30 and the operation of functional element 70 are substantially electrically isolated.

Figure 7:
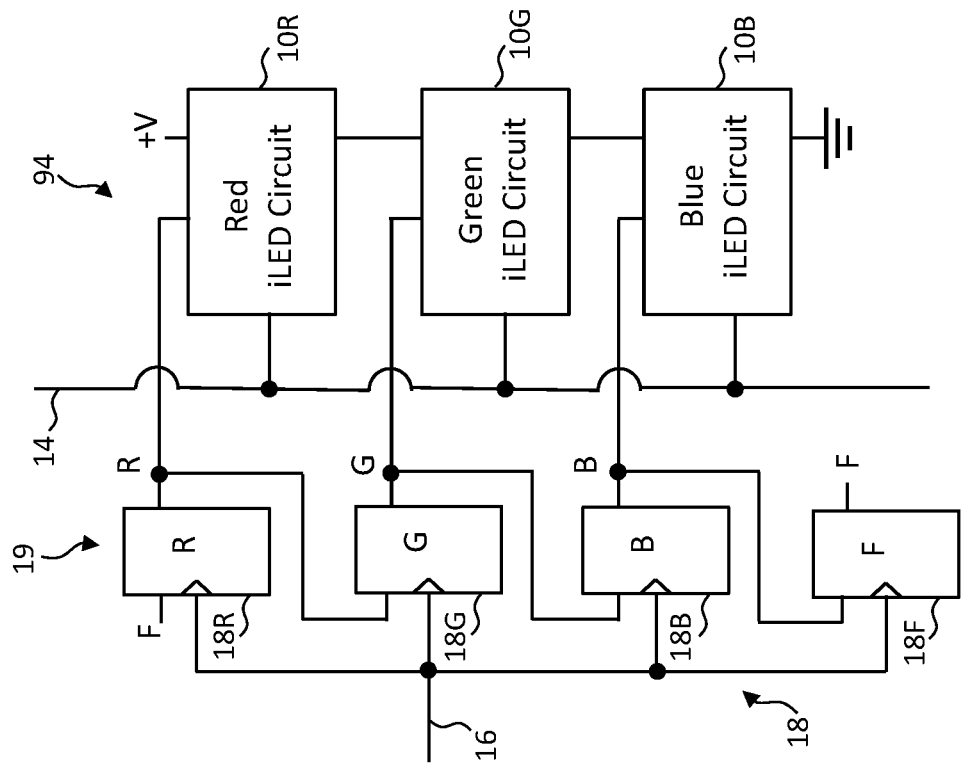
FIGS. 6-7 are block diagrams corresponding to pixels according to illustrative embodiments of the present disclosure.
Figure 6:
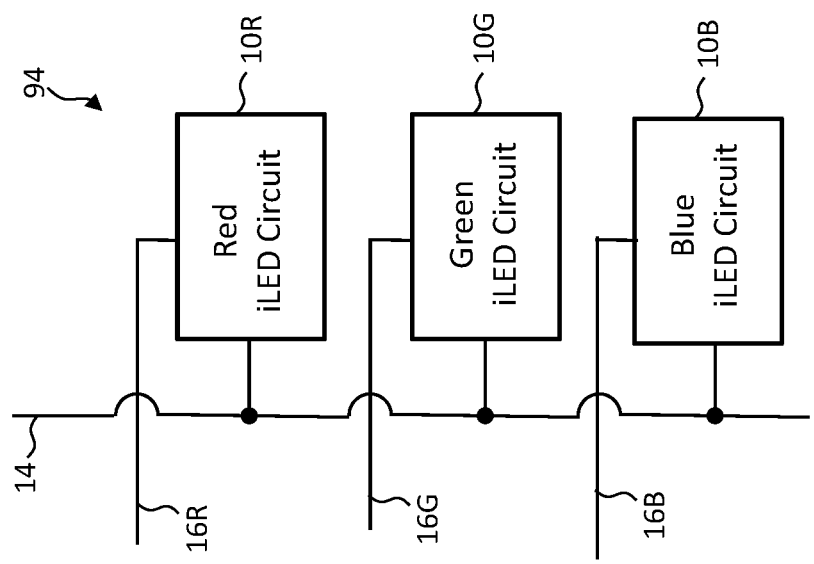
Figure 11:
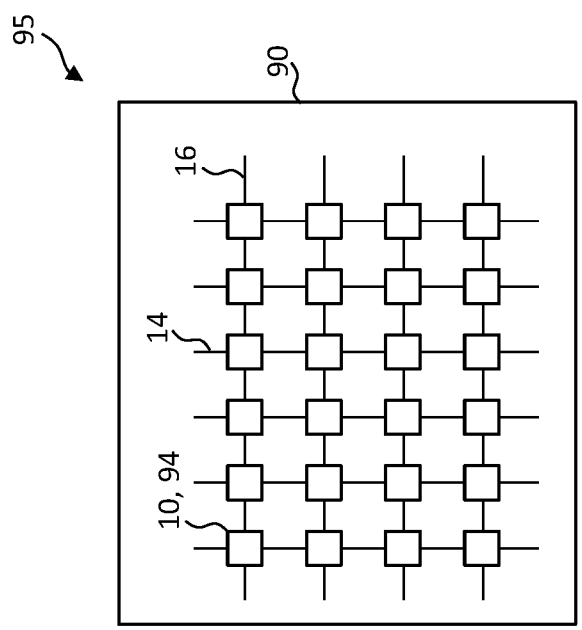
FIG. 11 is a schematic plan view of a display according to illustrative embodiments of the present disclosure.

As illustrated in FIG. 11, in some embodiments, analog PWM circuits 10 can control light-emitters (e.g., iLEDs 72) in arrays of pixels 94 disposed on a display substrate 90 in active-matrix displays 95. Each pixel 94 can comprise a separate row-control signal 16 (e.g., red row-control signal 16R, green row-control signal 16G, blue row-control signal 16B, collectively row-control signals 16) and a separate analog PWM circuit 10 for each iLED 72, for example as shown in FIG. 6. As illustrated in FIG. 7 and according to some embodiments of the present disclosure, a single row-control signal 16 for each pixel 94 can enable all of the analog PWM circuits 10 in pixel 94, e.g., red analog PWM circuit 10R, green analog PWM circuit 10G, and blue analog PWM circuit 10B (collectively analog PWM circuits 10). Referring to FIG. 7, a serial shift register 19, for example comprising serially connected row-control flipflops 18 powered up in a known configuration with a single control bit are clocked together by row-control signal 16 and shift the control bit sequentially through each of the red ('R'), green ('G'), and blue ('B'), row-control flipflops 18R, 18G, 18B, in serial shift register 19 and then into a frame ('F') row-control flipflop 18F (collectively row-control flipflops 18). When red row-control flipflop 18R is enabled, column-data signal 14 provides a corresponding charge to red analog PWM circuit 10R. Row-control signal 16 then provides a clock signal that shifts the serial shift register 19 control bit to green row-control flipflop 19G and column-data signal 14 provides a corresponding charge to green analog PWM circuit 10G. Row-control signal 16 then shifts the serial shift register 19 control bit to blue row-control flipflop 19B and column-data signal 14 provides a corresponding charge to blue analog PWM circuit 10B. All of the analog PWM circuits 10 in pixel 94 are then loaded and row-control signal 16 shifts the control bit to frame row-control flipflop 18F. The analog PWM circuits 10 can then operate independently to control the luminance of iLEDs 72 for a suitable frame time before the process is repeated by shifting the control bit back into red row-control flipflop 18R. Thus, a charge corresponding to each color light emitter in pixel 94 is sequentially loaded into red, green, and blue analog PWM circuits 10R, 10G, 10B in response to repeated row-control signals 16 and repeated column-data signals 14. After each charge is loaded, the corresponding analog PWM circuit 10 functions to control the corresponding functional element 70.

As shown in FIGS. 8A-8F and according to some embodiments of the present disclosure, constant-current supply 60 is electrically connected in serial with digital switch 50 (e.g., switch transistor 52) and functional element 70 (e.g., iLED 72). These three elements can be serially connected in different orders. By serially connecting them in different orders, different voltages with respect to the other circuits in analog PWM circuit 10 can be applied to each of the other circuits that are best suited to the other circuits and analog PWM circuit 10. Referring to FIG. 8A, digital switch 50 is disposed between iLED 72 and constant-current supply 60 and iLED 72 is electrically connected to a ground. Referring to FIG. 8B, iLED 72 is disposed between digital switch 50 and constant-current supply 60 and digital switch 50 is electrically connected to a ground. Referring to FIG. 8C, constant-current supply 60 is disposed between iLED 72 and digital switch 50 and digital switch 50 is electrically connected to a ground. Referring to FIG. 8D, constant-current supply 60 is disposed between iLED 72 and digital switch 50 and iLED 72 is electrically connected to a ground. Referring to FIG. 8E, digital switch 50 is disposed between iLED 72 and constant-current supply 60 and constant-current supply 60 is electrically connected to a ground. Referring to FIG. 8F, iLED 72 is disposed between digital switch 50 and constant-current supply 60 and constant-current supply 60 is electrically connected to a ground. Furthermore, in some analog PWM circuit designs, power (Vdd) and ground signals can be exchanged to operate in inverted mode or particular circuits (e.g., analog storage circuit 30 or discharge circuit 40) can be connected to Vdd. Moreover, if depletion-mode FETs are used in place of enhancement-mode FETs, the depletion-mode FET gates can be connected to the drain rather than the source, or vice versa depending on the type of FET (e.g., JFET, MOSFET, or MESFET). Likewise, control signals 12 can be inverted signals that are active low rather than active high.

In some embodiments, pairs of transistors electrically connected in parallel (e.g., an n-channel and a p-channel transistor) can be used to implement circuits of the analog PWM circuit 10, for example load circuit 20.

Embodiments of the present disclosure enable active-matrix display pixel light-emitter control with reduced time frequency and complexity, e.g., fewer components. Additional circuit elements can be added to analog PWM circuit 10 to improve performance, for example to improve temperature stability and robust operation in the presence of components with variable performance due to manufacturing variability.

Figure 12:
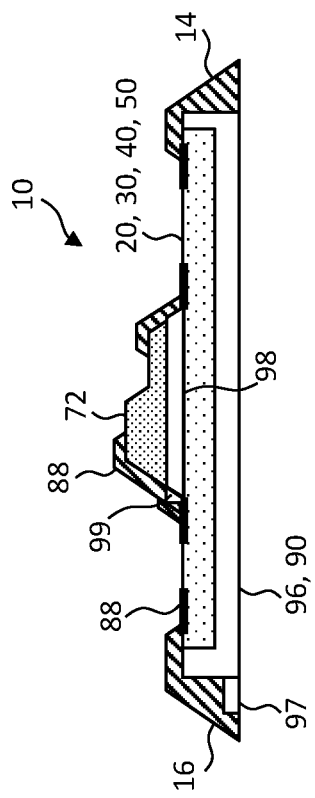
FIG. 12 is a schematic cross section of a functional element according to illustrative embodiments of the present disclosure.
Figure 13:
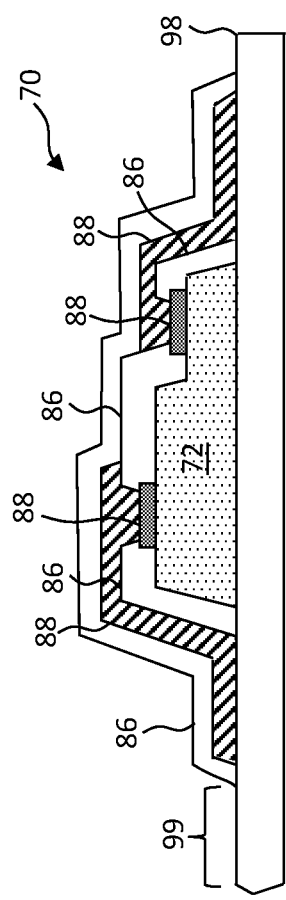
FIG. 13 is a schematic cross section of an analog PWM circuit according to illustrative embodiments of the present disclosure.

According to some embodiments of the present disclosure and as shown in FIG. 12, functional elements 70 (e.g., iLED 72) can comprise compound semiconductor materials formed in or on an element substrate 98 separate (e.g., independent and different) from circuit substrate 96 (e.g., where element substrate 98 is non-native to circuit substrate 96). Compound semiconductor materials suitable for an iLED 72 can be disposed on element substrate 98 together with dielectric material 86 to insulate and protect iLED 72 and electrical connections 88 (e.g., wires, electrodes, connection pads) to provide electrical control of iLED 72. As shown in FIG. 13, functional elements 70 with element substrate 98 can be assembled on circuit substrate 96, for example using transfer printing, e.g., micro-transfer printing, and electrically connected using photolithographic methods and materials. transistors comprising the various circuits and electrical connections 88 (e.g., wires, electrodes, connection pads) between the various circuits in analog PWM circuit 10. Circuit and electrical connections 88 can be formed on circuit substrate 96 using photolithographic processes as is known in the integrated circuit and display arts.

Figure 14:
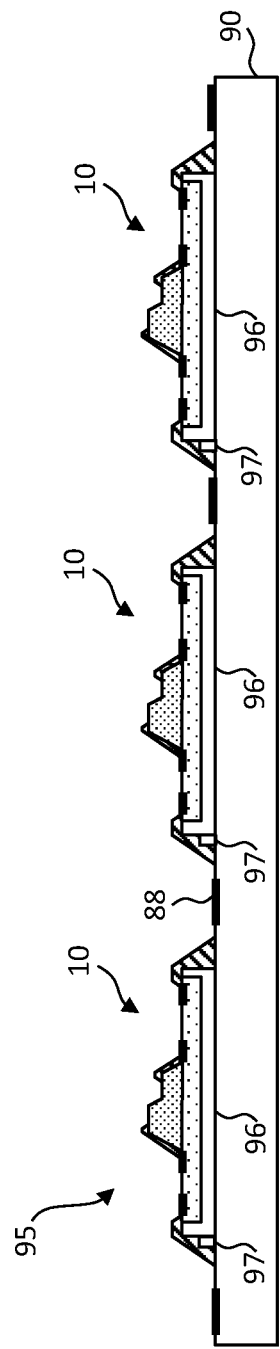
FIG. 14 is a schematic cross section of a display according to illustrative embodiments of the present disclosure.

According to some embodiments, circuit substrate 96 is a display substrate 90, as indicated in FIG. 13. In some embodiments and as shown in FIGS. 14 and 15, circuit substrate 96 is separate (e.g., independent and different) from (e.g., is non-native to) display substrate 90 and circuit substrate 96 is disposed on display substrate 90, for example by transfer printing, e.g., micro-transfer printing. As shown in the plan view and perspective schematics of FIGS. 11 and 15 and according to some embodiments of the present disclosure, arrays of pixels 94 each comprising one or more analog PWM circuits 10 including iLEDs 72 (e.g., red, green, and blue iLEDs 72R, 72G, 72B) are disposed on circuit substrates 96 that are transfer printed onto display substrate 90 to make active-matrix display 95 controlled by display controller 74 with control signals 12. When pixels 94 comprise multiple analog PWM circuits 10, constant-control supply 60 can be shared between or common to two or more analog PWM circuits 10 of a set of multiple analog PWM circuits 10.

In some embodiments, circuit substrate 96 is a semiconductor substrate, for example comprising a crystalline semiconductor material such as silicon. In some embodiments, circuit substrate 96 is a dielectric (e.g., glass or polymer) coated with a semiconductor layer, for example a thin-film amorphous or polycrystalline layer. Element substrate 98 can be a compound semiconductor, for example a crystalline compound semiconductor such as GaN, GaAs, InGaN or other compound semiconductors (e.g., III-V or II-VI semiconductors) known in the art, including compound semiconductors used to construct iLEDs 72. Functional element 70 can comprise element substrate 98. Element and circuit substrate 98, 96 can comprise multiple layers of different materials, for example seed layers, dielectric layers, and semiconductor layers.

Therefore, according to some embodiments of the present disclosure, an analog PWM circuit 10 comprises a circuit substrate 96, in or on which one or more of load circuit 20, analog storage circuit 30, discharge circuit 40, digital switch 50, and constant-current supply 60 are formed or disposed, and a functional element 70 (e.g., an iLED 72) comprising an element substrate 98 separate (e.g., independent) from circuit substrate 96 is disposed on circuit substrate 96. According to some embodiments, element substrate comprises a fractured or separated element tether 99, for example resulting from micro-transfer printing functional element 70 from a functional element source wafer to circuit substrate 96. Similarly, circuit substrate 96 can comprise a fractured or separated circuit tether 97, for example resulting from micro-transfer printing circuit substrate 96 from a circuit substrate source wafer to a destination substrate, such as display substrate 90, for example as shown in FIGS. 12 and 13. Thus, in some embodiments, an element substrate 98 is non-native to a circuit substrate 96. In some embodiments, functional element 70 is disposed on or at least partially in an element substrate 98 and electrically connected to one or more circuits of analog pulse-width-modulation circuit 10, which are disposed on or in a circuit substrate 96 non-native to the element substrate 98.

By providing separate circuit and element substrates 96, 98, a denser and more integrated structure can be constructed efficiently with reduced material loss and improved, since each substrate can be made on a separate native source wafer adapted to each component and each substrate can be micro-assembled, without packaging, into a completed analog PWM circuit 10 useful in active-matrix display 95.

Display substrate 90 can have opposing parallel sides over or on one of which pixels 94 are disposed. For example, display substrate 90 can be a flat-panel substrate found in the display industry such as glass, polymer, ceramic, metal, sapphire, or quartz. Pixels 94 can each comprise one or more light-emitting elements in analog PWM circuits 10, for example red-light-emitting red iLED 72R, green-light-emitting green iLED 72G, and blue-light-emitting blue iLED 72B, collectively referred to as iLEDs 72. iLEDs 72 can be arranged to emit light through display substrate 90 or away from display substrate 90.

According to some embodiments of the present disclosure, iLEDs 72 are micro-LEDs 72 with at least one of a width and a length that is no greater than 500 microns (e.g., no greater than 200 microns, no greater than 100 microns, no greater than 50 microns, no greater than 25 microns, no greater than 15 microns, no greater than 12 microns, no greater than 8 microns, or no greater than 5 microns). iLEDs 72 can have different sizes. Micro-LEDs 72 provide an advantage according to some embodiments of the present disclosure since they are sufficiently small and can be disposed spatially close together so that the different micro-LEDs 72 in a pixel 94 cannot be readily distinguished by the human visual system in a display at a desired viewing distance, improving color mixing of light emitted by a pixel 94 and providing apparent improvements in display resolution.

Methods of forming useful micro-transfer printable structures are described, for example, in the paper "AMOLED Displays using Transfer-Printed Integrated Circuits," *Journal of the SID*, 19(4), 2012, and U.S. Pat. No. 8,889,485. For a discussion of micro-transfer printing techniques see, U.S. Pat. Nos. 8,722,458, 7,622,367 and 8,506,867, the disclosures of which are hereby incorporated by reference in their entirety. Micro-transfer printing using compound micro-assembly structures and methods can also be used with the present disclosure, for example, as described in U.S. patent application Ser. No. 14/822,868, filed Aug. 10, 2015, entitled "Compound Micro-Assembly Strategies and Devices," the disclosure of which is hereby incorporated by reference in its entirety. In some embodiments, pixels 94 are compound micro-assembled devices.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST 10 analog PWM circuit
10B blue analog PWM circuit
10G green analog PWM circuit
10R red analog PWM circuit
12 control signals
14 column-data signal
16 row-control signal
16B blue row-control signal
16G green row-control signal
16R red row-control signal
18 row-control flipflop
18B blue row-control flipflop
18F frame row-control flipflop
18G green row-control flipflop
18R red row-control flipflop
19 serial shift register
20 load circuit
22 load transistor
24 amplifier
30 analog storage circuit
32 storage capacitor
34 storage signal
40 discharge circuit
42 discharge transistor
44 discharge resistor
50 digital switch
52 switch transistor
54 switch signal
60 constant-current supply
62 integrated current-supply discharge circuit
64 current-control signal
66 integrated current discharge and control circuit
68 integrated digital switch and constant-current supply
70 functional element
72 iLED
72B blue iLED
72G green iLED
72R red iLED
74 display controller
80 output control circuit 82 output control transistor
84 inverter
86 dielectric material
88 electrical connections/wires
90 display substrate
91 blue iLED efficiency
91M blue iLED efficiency maximum
92 green iLED efficiency
92M green iLED efficiency maximum
93 red iLED efficiency
93M red iLED efficiency maximum
94 pixel
95 active-matrix display
96 circuit substrate
97 circuit tether
98 element substrate
99 element tether

The invention claimed is:

1. An analog pulse-width-modulation circuit, comprising:
an analog storage circuit;
a load circuit responsive to control signals to load the analog storage circuit;
a discharge circuit operable to discharge the analog storage circuit over time;
a constant-current supply that provides a constant current;
a digital switch responsive to the discharge circuit to switch the constant current; and
a functional element connected to the digital switch that operates in response to the constant current when provided,
wherein a current-control signal input into the analog pulse-width-modulation circuit specifies a magnitude of the constant current of the constant current circuit and controls the discharge circuit.

2. The analog pulse-width-modulation circuit of claim 1, comprising an output control circuit that isolates the discharge circuit from the analog storage circuit or connects the discharge circuit to the analog storage circuit.

3. The analog pulse-width-modulation circuit of claim 1, wherein the analog storage circuit comprises a capacitor.

4. The analog pulse-width-modulation circuit of claim 1, wherein one or more of the load circuit, the discharge circuit, and the digital switch comprises a transistor.

5. The analog pulse-width-modulation circuit of claim 4, wherein the transistor comprises a depletion-mode JFET, MOSFET, or MESFET, an enhancement mode JFET, MOSFET, or MESFET, an n-channel JFET, MOSFET, or MESFET, or a p-channel JFET, MOSFET, or MESFET.

6. The analog pulse-width-modulation circuit of claim 1, wherein the functional element comprises an inorganic light-emitting diode.

7. The analog pulse-width-modulation circuit of claim 1, wherein the discharge circuit comprises a resistor.

8. The analog pulse-width-modulation circuit of claim 7, wherein the discharge circuit comprises a transistor electrically connected in series with the resistor.

9. The analog pulse-width-modulation circuit of claim 1, wherein the discharge circuit and the constant-current supply are a combined circuit.

10. The analog pulse-width-modulation circuit of claim 1, wherein the digital switch is a bipolar transistor and the discharge circuit and the digital switch are a combined circuit that discharges the analog storage circuit through the digital switch.

11. The analog pulse-width-modulation circuit of claim 1, wherein the discharge circuit and the digital switch are a combined circuit.

12. The analog pulse-width-modulation circuit of claim 1, wherein the digital switch, the functional element, and the constant-current supply are electrically connected in series.

13. The analog pulse-width-modulation circuit of claim 1, wherein the functional element operates more efficiently at one current than another current or is most efficient at a pre-determined current.

14. An analog pulse-width-modulation pixel circuit, comprising:
two or more analog pulse-width-modulation circuits according to claim 1, wherein, for each of the two or more analog pule-width-modulation circuits, the functional element comprises a light emitter; and
a control shift register operable to provide a control signal for each of the two or more analog pulse-width-modulation circuits,
wherein the shift register is operable to sequentially provide a load signal to each of the analog pulse-width-modulation circuits in response to a control signal.

15. The analog pulse-width-modulation pixel circuit of claim 14, wherein the functional element in each of the two or more analog pulse-width-modulation circuits operates most efficiently at a different constant current.

16. The analog pulse-width-modulation pixel circuit of claim 14, wherein the light emitter is an inorganic light-emitting diode.

17. An analog pulse-width-modulation display, comprising:
a display substrate; and
an array of analog pulse-width-modulation pixel circuits according to claim 14 arranged in rows and columns on the display substrate, wherein the display is operable to provide a control signal of the control signals in common to each pixel circuit of the analog pulse-width-modulation pixel circuits in each of the rows, each of the columns, or both each of the rows and each of the columns.

18. An analog pulse-width-modulation structure, comprising:
a circuit substrate;
an element substrate separate from the circuit substrate; and
an analog pulse-width-modulation circuit according to claim 1,
wherein any one or more of the load circuit, the analog storage circuit, the discharge circuit, the digital switch, and the constant-current supply are disposed on or in the circuit substrate, and
wherein the functional element is disposed on or at least partially in the element substrate and electrically connected to at least one of the load circuit, the analog storage circuit, the discharge circuit, the digital switch, and the constant-current supply.

19. The analog pulse-width-modulation structure of claim 18, wherein the circuit substrate comprises a semiconductor and a fractured or separated circuit tether and the element substrate comprises a fractured or separated element tether.

* * * * *